(12) United States Patent
Moon et al.

(10) Patent No.: US 9,166,120 B2
(45) Date of Patent: Oct. 20, 2015

(54) LED DEVICE HAVING IMPROVED LUMINOUS EFFICACY

(75) Inventors: Kyung Mi Moon, Suwon-si (KR); Jung Hye Chae, Suwon-si (KR); Hyung Kun Kim, Suwon-si (KR); Se Hwan An, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/238,963

(22) PCT Filed: Aug. 16, 2011

(86) PCT No.: PCT/KR2011/005992
§ 371 (c)(1),
(2), (4) Date: Feb. 14, 2014

(87) PCT Pub. No.: WO2013/024911
PCT Pub. Date: Feb. 21, 2013

(65) Prior Publication Data
US 2014/0197443 A1    Jul. 17, 2014

(51) Int. Cl.
*H01L 33/00* (2010.01)
*H01L 33/50* (2010.01)
*H01L 33/54* (2010.01)
*H01L 33/56* (2010.01)
*H01L 33/60* (2010.01)

(52) U.S. Cl.
CPC ............ *H01L 33/502* (2013.01); *H01L 33/507* (2013.01); *H01L 33/508* (2013.01); *H01L 33/54* (2013.01); *H01L 33/56* (2013.01); *H01L 33/60* (2013.01)

(58) Field of Classification Search
CPC ..... H01L 33/502; H01L 33/508; H01L 33/54; H01L 33/56

USPC .............................................. 257/98, 99, 100
See application file for complete search history.

(56) References Cited

U.S. PATENT DOCUMENTS

| 7,344,902 | B2 | 3/2008 | Basin et al. | |
|---|---|---|---|---|
| 8,299,489 | B2 * | 10/2012 | Wu et al. | 257/98 |
| 2003/0080341 | A1 | 5/2003 | Sakano et al. | |
| 2006/0170335 | A1 | 8/2006 | Cho et al. | |

(Continued)

FOREIGN PATENT DOCUMENTS

| JP | 2001-148516 A | 5/2001 |
|---|---|---|
| JP | 3428597 B2 | 7/2003 |

(Continued)

OTHER PUBLICATIONS

International Search Report, w/ English translation thereof, issued in International Application No. PCT/KR2011/005992 dated Apr. 6, 2012.

*Primary Examiner* — Minh-Loan Tran
(74) *Attorney, Agent, or Firm* — McDermott Will & Emery LLP

(57) ABSTRACT

There are provided a light emitting diode (LED) device including an LED chip emitting light within a specific wavelength region, a transparent resin layer covering a light emission surface of the LED chip, and a color conversion layer formed to be spaced apart from the LED chip by the transparent resin layer to cover the transparent resin layer and including at least one type of phosphor converting light emitted from the LED chip into light within a different wavelength region, wherein a mean free path of phosphor particles included in the color conversion layer is 0.8 mm or more at a temperature of 5500 K.

20 Claims, 4 Drawing Sheets

(56) References Cited

U.S. PATENT DOCUMENTS

2007/0096128 A1* 5/2007 Fukudome et al. ............ 257/98
2009/0322205 A1* 12/2009 Lowery ........................ 313/493
2010/0102340 A1 4/2010 Ooya et al.
2010/0322275 A1 12/2010 Ishii et al.
2011/0031523 A1 2/2011 Ishii et al.

FOREIGN PATENT DOCUMENTS

| KR | 10-2006-0087985 A | 8/2006 |
| KR | 10-2009-0057114 A | 6/2009 |
| KR | 10-2009-0096543 A | 9/2009 |
| KR | 10-2010-0127278 A | 12/2010 |
| KR | 10-2011-0102063 A | 9/2011 |

* cited by examiner

LED DEVICE HAVING IMPROVED LUMINOUS EFFICACY

RELATED APPLICATIONS

This application is the U.S. National Phase under 35 U.S.C. §371 of International Application No. PCT/KR2011/005992, filed on Aug. 16, 2011, the disclosure of which Application is incorporated by reference herein.

TECHNICAL FIELD

Aspects of embodiments relate to an LED device, and more particularly, to an LED device including an LED chip and a phosphor excited by light emitted therefrom to allow light having a different wavelength to be emitted.

BACKGROUND ART

A light emitting diode (LED) has many positive attributes such as a relatively long lifespan, relatively low power consumption, a rapid response rate, environmentally friendly characteristics, and the like, as compared to a light source according to the related art, and has been used as an important light source in various products such as illumination devices, back light units and the like. In a light emitting device using such an LED, a technology of using a phosphor for converting light emitted by an LED chip into different wavelengths of light has been widely used. In particular, the demand for the wavelength conversion technology as described above has increased in the areas of white light emitting devices required in various types of illumination devices and in backlight units for display devices.

A white LED device performs color conversion on a portion of light emitted from an ultraviolet (UV) or blue LED chip through a combination of red, green, blue (RGB) or yellow (Y) phosphors, and implements white light by mixing light emitted from the LED chip and light obtained through the color conversion or mixing several wavelengths of light obtained through the color conversion. In order to obtain high efficiency white light, research into improved conversion efficiency in color conversion materials such as phosphors, as well as improvements in LED chip outputs, has been actively conducted.

FIG. 1 is a cross-sectional view of a white LED device according to the related art. With reference to FIG. 1, an LED device 10 includes a package body 11 including a reflective cup therein, an LED chip 15 and a phosphor layer 12. In general, the phosphor layer 12 may be formed of a resin containing a phosphor. A lens or encapsulating resin part 14 is formed on the phosphor layer 12. The LED chip 15 and the phosphor layer 12 are disposed in an inner portion of the reflective cup (using a cup filling scheme). Since the phosphor layer 12 contacts the immediate vicinity of the LED chip 15, color conversion is initially performed by a phosphor of the phosphor layer 12 and emission of light is then induced through the lens or the encapsulating resin 14.

However, a portion of light emitted from the LED chip 15 is not color-converted by the phosphor of the phosphor layer 12, but is reflected or scattered to be re-absorbed by the LED chip 15, thereby causing a considerable amount of light loss. In addition, heat generated by the LED chip 15 is directly transferred to the phosphor layer 12, such that a reduction in color conversion efficiency may occur. Further, in terms of the inner portion of the phosphor layer 12, since light emitted by the phosphor is re-absorbed by a different phosphor, light loss may occur.

DISCLOSURE

Technical Problem

An aspect of an embodiment provides an LED device capable of reducing light loss while providing a high degree of light efficiency and improved brightness. In addition, an aspect of an embodiment provides an LED device capable of reducing light loss and providing a high degree of light efficiency and improved brightness while outputting white light. Further, an aspect of an embodiment provides an LED device capable of reducing light loss, providing a high degree of light efficiency and improved brightness, and being suitable for high output.

Technical Solution

An aspect of an embodiment provides an LED device including an LED chip emitting light within a specific wavelength region; a transparent resin layer covering a light emission surface of the LED chip; and a color conversion layer formed to be spaced apart from the LED chip by the transparent resin layer to cover the transparent resin layer and including at least one type of phosphor converting light emitted from the LED chip into light within a different wavelength region, wherein a mean free path of phosphor particles included in the color conversion layer is 0.8 mm or greater at a temperature of 5500 K.

The mean free path may range from 0.8 mm to 1.05 mm at the temperature of 5500 K. A volume of the color conversion layer may be equal to 5 or more times that of the transparent resin layer. The volume of the color conversion layer may range from 5 or more times to 15 or less times the volume of the transparent resin layer.

The LED device may emit white light using the LED chip and the color conversion layer.

The transparent resin layer may have an upwardly convex upper surface, and a curvature of the upper surface of the transparent resin layer may be 0.5 mm$^{-1}$ or greater in a central portion thereof. The transparent resin layer may have an upwardly convex upper surface, and a curvature of the upper surface of the transparent resin layer may range from 0.5 mm$^{-1}$ to 2 mm$^{-1}$ in a central portion thereof.

The transparent resin layer may have a thickness equal to three or more times that of the LED chip, from an upper surface of the LED chip. The transparent resin layer may have a thickness of 3 to 10 times that of the LED chip, from the upper surface of the LED chip.

The transparent resin layer may have a refractive index of 1.4 or more. The transparent resin layer may have a refractive index of 1.4 to 2.2.

The LED device may further include a package body including a reflective cup disposed therein containing the LED chip mounted therein, and the transparent resin layer and the color conversion layer may be disposed in the reflective cup. An inner surface of the reflective cup may include a stepped portion formed therein, and an interface between the transparent resin layer and the color conversion layer may contact the inner surface of the reflective cup at the stepped portion.

The LED device may further include a substrate including the LED chip mounted thereon, the transparent resin layer may cover the LED chip on the substrate, and the color conversion layer may cover the transparent resin layer on the substrate.

The color conversion layer may include two or more types of phosphors depending on wavelengths of emitted light and may have a structure in which a plurality of phosphor layers are stacked, in which the two or more types of phosphors are separated into respective layers thereof depending on the wavelengths of emitted light.

The LED chip may be a blue LED chip and the color conversion layer may include a yellow phosphor. The color conversion layer may further include a green phosphor and a red phosphor. The color conversion layer may include the red phosphor layer covering the transparent resin layer, and a mixed phosphor layer including the green phosphor and the yellow phosphor covering the red phosphor layer.

The LED chip may be the blue LED chip and the color conversion layer may include a red phosphor and a green phosphor. The color conversion layer may include the red phosphor layer covering the transparent resin layer and a green phosphor layer covering the red phosphor layer.

The LED chip may be an ultraviolet LED chip and the color conversion layer may include a red phosphor, a green phosphor and a blue phosphor. The color conversion layer may include the red phosphor layer covering the transparent resin layer, the green phosphor layer covering the red phosphor layer, and a blue phosphor layer covering the green phosphor layer.

Advantageous Effects

According to an embodiment of the inventive concept, the extraction of light emitted from an LED chip may be increased and light loss due to phosphor particles may be effectively reduced. In addition, the amount of light reflected by a phosphor to then be absorbed and lost by an LED chip may be reduced, and degradation of a phosphor due to heat may be reduced. Therefore, an LED device such as a white LED having high efficiency may also be implemented at a relatively high output. Since the volume of a color conversion layer is relatively great, when an LED device is manufactured, formation of a color conversion layer may provide relatively high curvature tolerance. In addition, since sufficient color conversion may also be performed in high current and high output conditions, a change in color coordinates may not occur or may be relatively slight.

DESCRIPTION OF DRAWINGS

The above and other aspects, features and other advantages will be more clearly understood from the following detailed description taken in conjunction with the accompanying drawings, in which.

MODE FOR INVENTION

Figure 1:
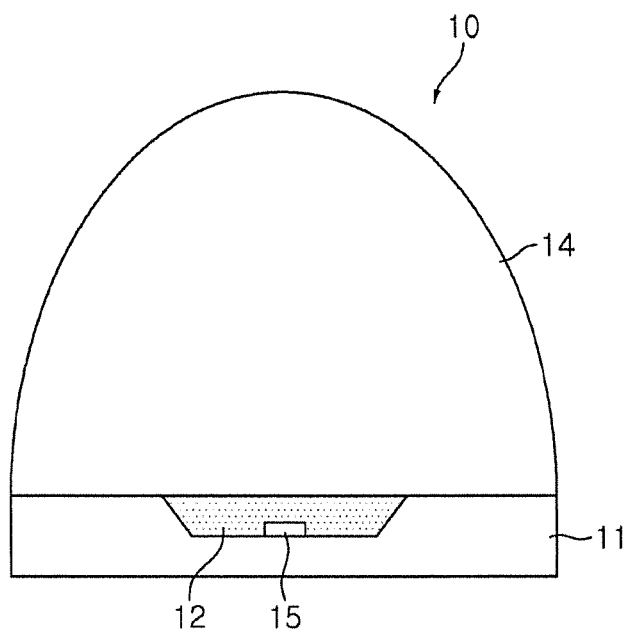
FIG. 1 is a cross-sectional view of a white LED device according to the related art.

Hereinafter, embodiments will be described in detail with reference to the accompanying drawings. Embodiments may, however, be embodied in many different forms and should not be construed as being limited to embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity.

Figure 2:
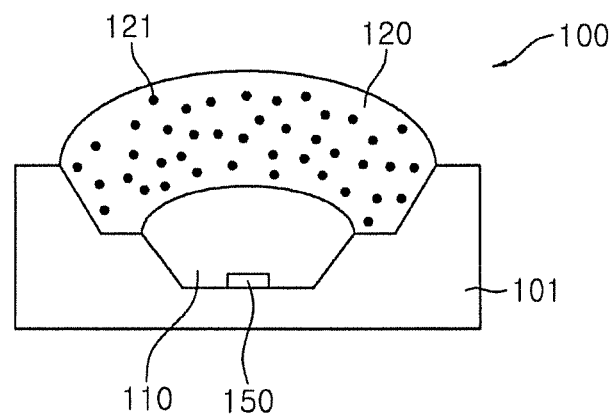
FIG. 2 is a cross-sectional view of an LED device according to an embodiment of the inventive concept.

FIG. 2 is a cross-sectional view of an LED device according to an embodiment of the inventive concept. With reference to FIG. 2, an LED device 100 may include a blue LED chip 150 mounted in a package body 101, a transparent resin layer 110 covering a light emission surface of the blue LED chip 150, and a color conversion layer 120 covering the transparent resin layer 110. The blue LED chip 150 may be mounted in a reflective cup of the package body 101, and the transparent resin layer 110 and the color conversion layer 120 may be disposed to fill the inside of the package body 101.

Although a phosphor is not included in the transparent resin layer 110, a yellow phosphor 121 excited by blue light emitted from the blue LED chip 150 to emit yellow light may be included in the color conversion layer 120. A portion of light emitted from the blue LED chip 150 may be converted into yellow light by the yellow phosphor 121, and the yellow light and blue light emitted from the blue LED chip 150 may be mixed with each other to thereby form white light.

The color conversion layer 120 may be formed of, for example, a phosphor containing resin in which particles of the yellow phosphor 121 are dispersed in a transparent resin such as a silicon resin or the like. The color conversion layer 120 may be spaced apart from the LED chip 150 by the transparent resin layer 110 by interposing the transparent resin layer 110 between the color conversion layer 120 and the blue LED chip 150. Therefore, the color conversion layer 120 and the yellow phosphor 121 included therein may be spaced apart from the LED chip 150 without contacting the LED chip 150.

The color conversion layer 120 may have a relatively dilute phosphor concentration, for example, diluted by around 5 to 9 times as compared to existing phosphor-containing resin layers. As described above, the phosphor having a relatively low concentration of phosphors may have a different value depending on the structure and size of the package, but a mean free path (MFP) of phosphor (121) particles may be 0.8 mm or greater at a temperature of 5500 K. For example, the MFP of the phosphor 121 particles may be 0.8 to 1.05 mm at a temperature of 5500 K. In the case of the existing white LED package (see FIG. 1), the MFP of phosphor particles in the color conversion layer or the phosphor layer (see reference number 12 of FIG. 1) is 0.2 mm or less, but according to the present embodiment, an MFP value much higher than the value above according to the related art may be used. As such, by using a relatively great MFP value, the color conversion layer 120 including the phosphor 121 particles dispersed therein may be disposed to be spaced apart from the LED chip 150, such that scattering and reflection of light by phosphor particles in the color conversion layer 120 may be reduced and re-absorption of light between the phosphor particles may be decreased, whereby light loss may be decreased while light efficiency and brightness may be improved.

In order to obtain sufficient color conversion, that is, conversion of light emitted from an LED chip into different wavelength light, while securing a relatively great MFP value as described above, the color conversion layer 120 may have the volume equal to 5 or more times that of the transparent resin layer 110. For example, the volume of the color conversion layer 120 may range from 5 or more times to 15 or less times the volume of the transparent resin layer 110.

With reference to FIG. 2, an upper surface of the transparent resin layer 110 may be an upwardly convex shape so as to be suitable for the extraction of light emitted from the blue LED chip 150. Monochromatic light, for example, blue light in the present embodiment, may be first extracted by the transparent resin layer 110, and wavelength conversion may then be performed using the color conversion layer 120 having a relatively dilute phosphor concentration, for example, an MFP of 0.8 mm or greater, thereby reducing light loss and promoting improved luminous fluxes.

In order to improve the extraction of monochromatic light using the transparent resin layer 110 in consideration of a high refractive index of, for example, around 2.5, in the blue LED chip 150, for example, a GaN-based LED chip, the transparent resin layer 110 may have a high refractive index of 1.4 or greater. For example, the refractive index of the transparent resin layer 110 may be 1.5 or greater, and in detail, may be 1.8 or greater. In addition, for example, the transparent resin layer 110 may have a refractive index of 1.4 to 2.2. Further, in order to improve light extraction, the transparent resin layer 110 may have a thickness equal to three or more times that of the blue LED chip 150, from an upper surface of the LED chip 150, and in further detail, may have a thickness equal to 5 or more times that of the blue LED chip 150, from the upper surface of the LED chip 150. For example, the transparent resin layer 110 may have a thickness ranging from 3 to 10 times that of the blue LED chip 150, from the upper surface of the blue LED chip 150.

In addition, sufficient thickness may be secured in the transparent resin layer 110 from the upper surface of the blue LED chip 150 by providing the transparent resin layer 110 such that a structural shape of a curvature of an upper surface of the transparent resin layer 110 may be 0.5 mm$^{-1}$ or greater, in greater detail, 1 mm$^{-1}$ or greater, in a central portion thereof, thereby significantly increasing light extraction efficiency. In detail, the curvature of the upper surface of the transparent resin layer 110 may range from 0.5 mm$^{-1}$ to 2 mm$^{-1}$. The shape of the transparent resin layer 110 described above may be implemented through various overmolding methods using compression molding, injection molding or the like. In addition to the overmolding method, the shape of the transparent resin layer 110 may be formed by applying an existing dispensing method thereto depending on viscosity of a coated resin material and a package shape. When the transparent resin layer 110 is formed using the dispensing method, an inner surface of a reflective cup of the package body 101 may have a stepped portion formed therein in order to facilitate the formation of the convex upper surface of the transparent resin layer 110. As shown in FIG. 2, an interface between the transparent resin layer 110 and the color conversion layer 120 may contact an inner surface of the reflective cup at the stepped portion.

As described above, monochromatic light, blue light in the present embodiment, extraction efficiency by the transparent resin layer 110 may be significantly increased, and the color conversion layer 120 in which monochromatic light wavelength conversion is performed may have a relatively dilute phosphor concentration, for example, MFP of 0.8 mm or greater, thereby significantly decreasing light loss. In the case of the existing LED device (see FIG. 1), light loss of around 40% is generated, but in the case of the LED device according to the present embodiment, light loss of 30% or less, in greater detail, a low degree of light loss of around 10% may be implemented. As a result, a relatively high luminous flux may be obtained in the LED device.

Figure 3:
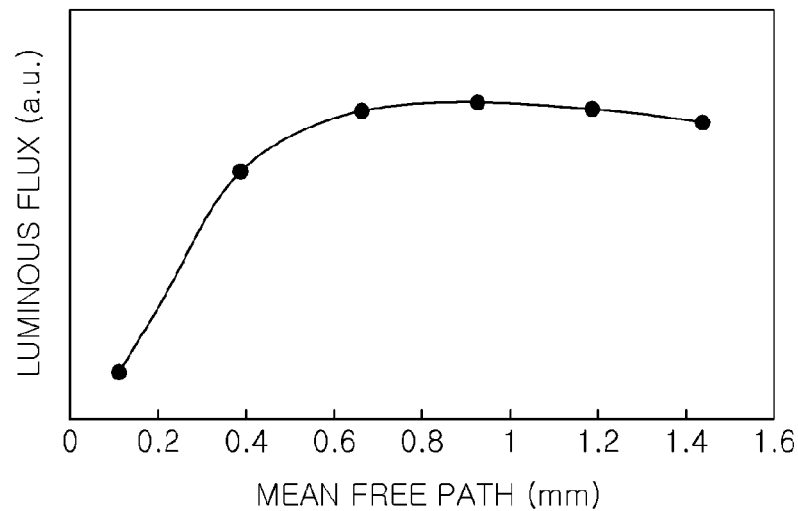
FIG. 3 is a graph illustrating a luminous flux based on a mean free path (MFP) of an LED device according to an embodiment.

FIG. 3 is a graph illustrating a change in brightness (a luminous flux) depending on mean free paths (MFPs) of phosphor particles in a color conversion layer in an LED device (see FIG. 2) according to an embodiment, and the graph is a simulation graph. As shown in FIG. 3, it can be appreciated that when an MFP is between 0.8 mm or greater and 1.05 mm or less, the highest luminous flux is provided.

As illustrated in equation below, MFP has an inverse proportion to a phosphor concentration. The trend for change in the brightness of the LED device, based on the MFPs, may be represented as illustrated in FIG. 3, $$L = \frac{1}{n\sigma}$$

where L=Mean Free Path, n=Phosphor Concentration (Density), σ=Cross Section of Phosphor.

Figure 4:
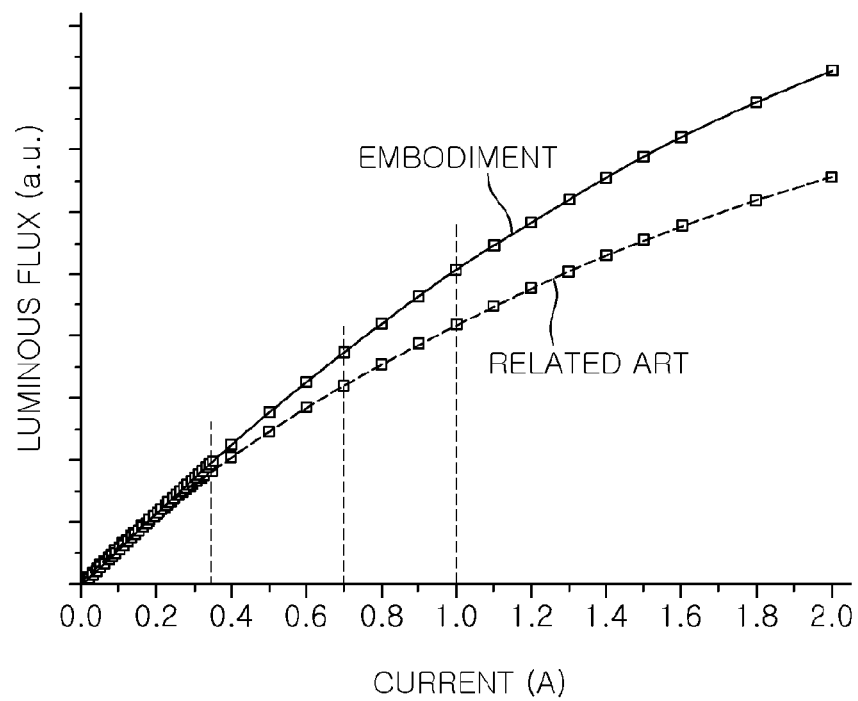
FIG. 4 is a graph illustrating luminous fluxes depending on a current of an LED device according to an embodiment of the inventive concept and an example of the related art.

In actual experimentation results according to embodiments, as compared to the LED device (see FIG. 1) using a cup filling scheme according to the related art, the LED device according to the embodiment as shown in FIG. 2 could obtain a luminous flux increased by 8 to 18% or more. The increase in the luminous flux as described above was remarkably represented in a high output region as illustrated in a graph of FIG. 4. FIG. 4 is a graph illustrating luminous fluxes of light output from an LED device, depending on a current applied thereto, according to the related art (see FIG. 1) and an embodiment (see FIG. 2). As illustrated in FIG. 4, when a high level of current is output at a high rate, a difference in luminous fluxes between the embodiment and the related art increases. In actual experimentation, in the related art (see FIG. 1), a phosphor layer including a phosphor and a resin at a weight ratio of 1:3 thereof was used, while in the embodiment (see FIG. 2), a color conversion layer including a phosphor and a resin at a weight ratio of 1:20 thereof was used. The color conversion layer according to the embodiment may have a relatively great mean free path as compared to that of the related art.

Figure 5:
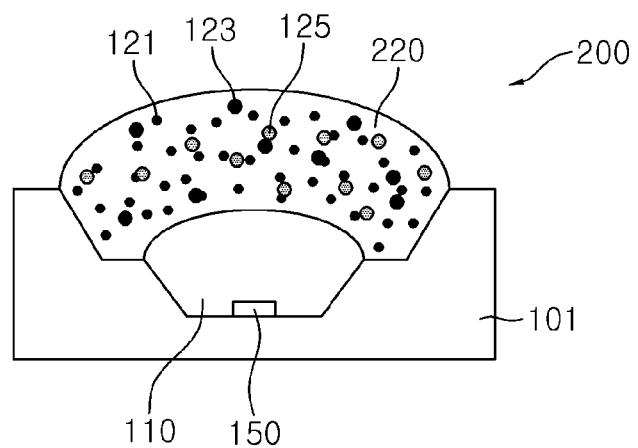
FIG. 5 is a cross-sectional view of an LED device according to another embodiment.

FIG. 5 is a cross-sectional view of an LED device 200 according to another embodiment. The embodiment of FIG. 5 may have a difference from the foregoing embodiment (see FIG. 2) in that a color conversion layer 220 of FIG. 5 may further include a red phosphor 123 and a green phosphor 125 while including a yellow phosphor 121. As the green and green phosphors are further used in addition to the use of the yellow phosphor, the LED device 200 may emit white light having a relatively high color rendering index or color reproduction characteristics. In connection with other terms, for example, a device structure, MFPs of phosphor (121, 123 and 125) particles, a thickness of a transparent resin layer 110, a curvature, refractive indexes, reduction in light loss, improvements in brightness, and the like are the same as those of the foregoing embodiment, and thus, descriptions thereof will be omitted.

Figure 6:
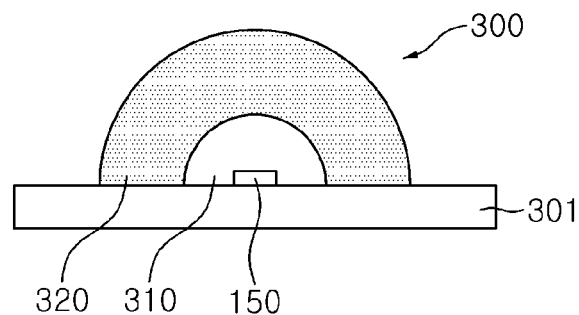
FIG. 6 is a cross-sectional view of an LED device according to another embodiment.

FIG. 6 illustrates an LED device 300 according to another embodiment. As illustrated in FIG. 6, the LED device 300 may include a blue LED chip 150, a transparent resin layer 310 and a color conversion layer 320 mounted on a substrate 301. The transparent resin layer 310 may cover the blue LED chip 150 on the substrate 301. The color conversion layer 320 may include a yellow phosphor and cover the transparent resin layer 310 on the substrate 301. When the substrate 301 is a circuit board, the blue LED chip 150, the transparent resin layer 310 and the color conversion layer 320 may be directly mounted and formed on the circuit board such that a chip on board (COB) LED device scheme may be implemented.

Figure 7:
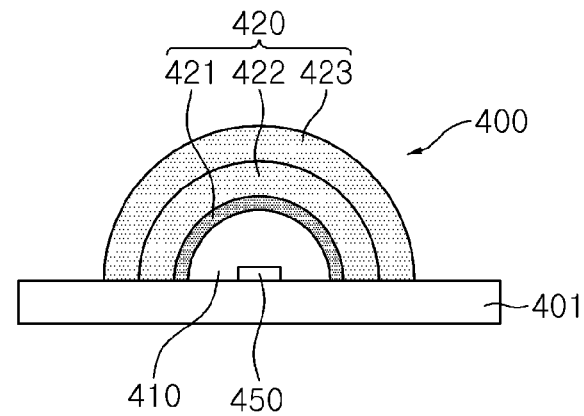
FIG. 7 is a cross-sectional view of an LED device according to another embodiment.

An LED device 400 according to another embodiment, shown in FIG. 7, may use an ultraviolet LED chip 450. A color conversion layer 420 including phosphors 421, 422 and 423 may be formed on a substrate 401 to cover an upper surface of a transparent resin layer 410. The color conversion layer 420 may include two or more types of phosphors and the phosphors may be separated into respective layers thereof depending on a phosphor type, that is, wavelengths of emitted light so as to have a structure in which a plurality of phosphor layers 421, 422 and 423 are stacked. In more detail, the color conversion layer 420 may have a stacked structure in which the red phosphor layer 421, the green phosphor layer 422 and the blue phosphor layer 423 are sequentially stacked. Ultraviolet (UV) light emitted from the ultraviolet LED chip 450 passes through the transparent resin layer 410 and may be converted into red light, green light and blue light by the color conversion layer 420. The red light, the green light and the blue light obtained through the color conversion described above may be mixed with each other to then be emitted as white light. Further, in the embodiment of FIG. 7, a COB-type LED device may also be implemented using a circuit board as the substrate 401.

Figure 8:
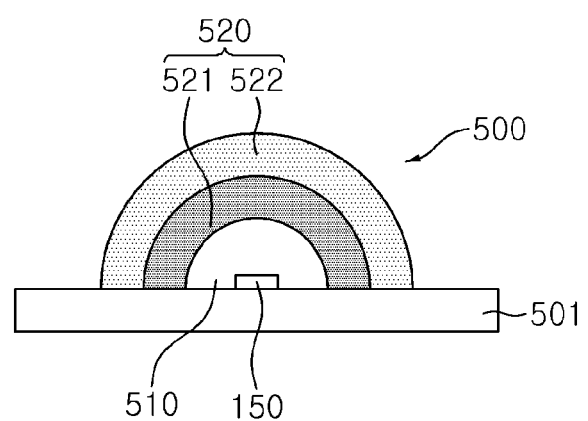
FIG. 8 is a cross-sectional view of an LED device according to another embodiment.

FIG. 8 illustrates an LED device according to another embodiment. An LED device 500 may include a blue LED chip 150, a transparent resin layer 510, and a color conversion layer 520 mounted on a substrate 501. The color conversion layer 520 may include a red phosphor layer 521 covering the transparent resin layer 510, and a green phosphor layer 522 covering the red phosphor layer 521. A portion of blue light emitted from the blue LED chip 150 may pass through the transparent resin layer 510 and be converted into red light and green light by the color conversion layer 520. The red light and the green light obtained through the color conversion and a portion of the blue light emitted from the blue LED chip 150 may be mixed with each other to then be emitted as white light. Further, in the embodiment of FIG. 8, a COB-type LED device may also be implemented using a circuit board as the substrate 501. As a modified example of the LED device 500 of FIG. 8, a mixed phosphor layer including a green phosphor and a yellow phosphor instead of the green phosphor layer 522 may be used. In this case, the mixed phosphor layer of the green and yellow phosphors may cover the red phosphor layer 521 and the red phosphor layer 521 may cover the transparent resin layer 510.

In addition, in the embodiments of FIGS. 6, 7 and 8, since the MFPs of phosphor particles in the color conversion layers 320, 420 and 520, the thicknesses of the transparent resin layers 310, 410 and 510, the curvature, the refractive indexes, the reduction in light loss, the improvements in brightness, and the like are described above with reference to FIG. 2, detailed descriptions thereof will be omitted.

While the inventive concept has been shown and described in connection with embodiments, it will be apparent to those skilled in the art that modifications and variations can be made without departing from the spirit and scope of the present inventive concept as defined by the appended claims.

The invention claimed is:

1. A light emitting diode (LED) device comprising:
   an LED chip emitting light within a specific wavelength region;
   a transparent resin layer covering a light emission surface of the LED chip; and
   a color conversion layer formed to be spaced apart from the LED chip by the transparent resin layer to cover the transparent resin layer and including at least one type of phosphor converting light emitted from the LED chip into light within a different wavelength region,
   wherein a mean free path of phosphor particles included in the color conversion layer is 0.8 mm or more at a temperature of 5500 K.

2. The LED device of claim 1, wherein the mean free path ranges from 0.8 mm to 1.05 mm at the temperature of 5500 K.

3. The LED device of claim 1, wherein a volume of the color conversion is 5 or more times that of the transparent resin layer.

4. The LED device of claim 1, wherein the volume of the color conversion layer ranges from 5 or more times and 15 or less times the volume of the transparent resin layer.

5. The LED device of claim 1, wherein the transparent resin layer has an upwardly convex upper surface, and a curvature of the upper surface of the transparent resin layer is $0.5 \text{ mm}^{-1}$ or greater in a central portion thereof.

6. The LED device of claim 1, wherein the transparent resin layer has an upwardly convex upper surface, and a curvature of the upper surface of the transparent resin layer ranges from $0.5 \text{ mm}^{-1}$ to $2 \text{ mm}^{-1}$ in a central portion thereof.

7. The LED device of claim 1, wherein the transparent resin layer has a thickness equal to three or more times that of the LED chip, from an upper surface of the LED chip.

8. The LED device of claim 1, wherein the transparent resin layer has a thickness ranging from three times to 10 times that of the LED chip, from an upper surface of the LED chip.

9. The LED device of claim 1, wherein the transparent resin layer has a refractive index of 1.4 or more.

10. The LED device of claim 1, wherein the transparent resin layer has a refractive index of 1.4 to 2.2.

11. The LED device of claim 1, wherein the LED device further comprises a package body including a reflective cup disposed therein containing the LED chip mounted therein, and the transparent resin layer and the color conversion layer are disposed in the reflective cup.

12. The LED device of claim 11, wherein an inner surface of the reflective cup includes a stepped portion formed therein, and an interface between the transparent resin layer and the color conversion layer contacts the inner surface of the reflective cup at the stepped portion.

13. The LED device of claim 1, wherein the LED device further comprises a substrate including the LED chip mounted thereon, the transparent resin layer covers the LED chip on the substrate, and the color conversion layer covers the transparent resin layer on the substrate.

14. The LED device of claim 1, wherein the LED chip is a blue LED chip and the color conversion layer includes a yellow phosphor.

15. The LED device of claim 14, wherein the color conversion layer further comprises a green phosphor and a red phosphor.

16. The LED device of claim 15, wherein the color conversion layer includes the red phosphor layer covering the transparent resin layer, and a mixed phosphor layer including the green phosphor and the yellow phosphor covering the red phosphor layer.

17. The LED device of claim 1, wherein the LED chip is the blue LED chip and the color conversion layer includes a red phosphor and a green phosphor.

18. The LED device of claim 17, wherein the color conversion layer includes the red phosphor layer covering the transparent resin layer and a green phosphor layer covering the red phosphor layer.

19. The LED device of claim 1, wherein the LED chip is an ultraviolet LED chip and the color conversion layer includes a red phosphor, a green phosphor and a blue phosphor.

20. The LED device of claim 19, wherein the color conversion layer includes the red phosphor layer covering the transparent resin layer, the green phosphor layer covering the red phosphor layer, and a blue phosphor layer covering the green phosphor layer.

* * * * *